United States Patent
Siefering et al.

(10) Patent No.: US 7,312,161 B2
(45) Date of Patent: Dec. 25, 2007

(54) ADVANCED PROCESS CONTROL FOR LOW VARIATION TREATMENT IN IMMERSION PROCESSING

(75) Inventors: Kevin L. Siefering, Excelsior, MN (US); Steven L. Nelson, Minnetonka, MN (US)

(73) Assignee: FSI International, Inc., Chaska, MN (US)

( * ) Notice: Subject to any disclaimer, the term of this patent is extended or adjusted under 35 U.S.C. 154(b) by 61 days.

(21) Appl. No.: 11/429,572

(22) Filed: May 5, 2006

(65) Prior Publication Data

US 2007/0257011 A1  Nov. 8, 2007

(51) Int. Cl.
*H01I 21/302* (2006.01)
(52) U.S. Cl. .............. 438/756; 438/8; 436/55
(58) Field of Classification Search ......... 438/756; 436/55, 43
See application file for complete search history.

(56) References Cited

U.S. PATENT DOCUMENTS

| | | |
|---|---|---|
| 5,472,516 A | 12/1995 | Hanson et al. |
| 5,578,273 A | 11/1996 | Hanson et al. |
| 5,715,173 A | 2/1998 | Nakajima et al. |
| 5,817,185 A | 10/1998 | Shindo et al. |
| 6,021,791 A | 2/2000 | Dryer et al. |
| 6,245,158 B1 | 6/2001 | Verhaverbeke |
| 6,261,845 B1* | 7/2001 | Verhaverbeke et al. ....... 436/55 |
| 6,766,818 B2 | 7/2004 | Kashkoush et al. |
| 6,767,877 B2 | 7/2004 | Kuo et al. |
| 2002/0104552 A1 | 8/2002 | Bay et al. |
| 2003/0094196 A1 | 5/2003 | Siefering et al. |
| 2003/0188765 A1 | 10/2003 | Christenson et al. |
| 2004/0185583 A1* | 9/2004 | Tomoyasu et al. ............. 438/8 |
| 2004/0203177 A1* | 10/2004 | Davis et al. ................... 438/14 |

* cited by examiner

*Primary Examiner*—Nadine Norton
*Assistant Examiner*—Mahmoud Dahimene
(74) *Attorney, Agent, or Firm*—Kagan Binder, PLLC

(57) ABSTRACT

The variability of immersion processes for treatment of semiconductor devices can be significantly lowered by initiating the termination of a treatment process according to a predetermined treatment termination protocol in a manner that takes into account the contribution of, in particular, the treatment that is carried out during the period of time in the treatment process in which the treatment process is being terminated. In a preferred embodiment, conditions that indicate the progress of the treatment on a real time basis are monitored, and the timing of the initiation of the termination process is additionally based on the calculated amount of treatment and treatment rate of the process in progress.

20 Claims, 1 Drawing Sheet

ADVANCED PROCESS CONTROL FOR LOW VARIATION TREATMENT IN IMMERSION PROCESSING

FIELD OF THE INVENTION

The present invention pertains generally to a method for providing low variability surface etching of semiconductor devices in an immersion process.

BACKGROUND OF THE INVENTION

The manufacture of microelectronic devices is often very complex, requiring a plurality of processing steps to be performed utilizing a variety of fluids, liquids and/or solutions. Further, due to the nature of microelectronic devices, the tolerance range for any degree of error or nonconformance to manufacturing standards is extremely low. Variability of treatment processes for microelectronic devices is introduced by the difficulty to control concentration and the temperature of chemicals used in the processes, particularly when comparing batch to batch uniformity of the treatment processes.

Various techniques have been used to attempt to improve consistency of treatment processes. For example, U.S. Pat. No. 6,261,845 to Verhaverbeke, et. al. describes systems and methods of determining the concentration of chemicals in a wet processing stream where the wet processing stream is formed from two or more liquid streams having known chemical concentrations. This process determines the concentration of each chemical by calculation based on the instantaneous or real time flow rate of the liquid streams during a given time interval. The thus calculated concentration of a wet processing stream is stated to be used to calculate the exposure time of the same wet processing stream with the semiconductor substrates. This system relies on the reliability of flow measuring devices to determine relative concentration of ingredients. The rate of flow in these systems is not controlled, but only monitored. The flow rate is thus subject to line pressure variations. There additionally is no indication that presumed flow rates are checked in any manner. Based on this calculated concentration level, the exposure time of the substrate to the wet process stream is calculated, and is stated to capable of being adjusted based on temperature and/or concentration variation. See Column 9, lines 19-23. The patent goes on to describe an example whereby a measured etch rate was plotted against measured and calculated HF concentrations. See Table 1. The Example does not report whether variation in temperature of the process bath was measured during the experiment. On the basis of this data, the Patentees concluded that the calculated HF concentration had less variation than the actually measured concentration, and that the resulting graph conformed to what the skilled artisan would have expected for a graph showing etch rate verses concentration of HF. See column 17, lines 1-4.

United States Patent Application Publication No. 2003/0094196 describes a system for advanced process control for immersion processing that is capable of providing a desired blend of at least two chemicals to an immersion bath as well as methods of treating substrates immersively. The system is capable of producing a blend with one or more desired properties extremely accurately due at least in part to the capability of the system to monitor at least one property of the blend or at least one parameter of the immersion process and to utilize the information gathered to provide dynamic closed-loop feedback control of one or more process parameters known to relate to the same.

It would be desirable to provide an immersion chemical processing system that is in particular capable of carrying out a treatment process with a low variability from batch to batch and from tool to tool.

SUMMARY OF THE INVENTION

In an aspect of the present invention, it has been discovered that immersion processes for treatment of semiconductor devices are very sensitive to process differences that can occur from batch to batch and from tool to tool due to lack of accounting for the treatment that occurs during the manufacturing process at the beginning, and particularly at the end of the process as the degree of treatment is increased or reduced. Surprisingly, this degree of treatment is not negligible, and substantial benefit in reduction of variability of manufacturing yield and/or performance of the product being processed can be realized by designing the process to factor in the predicted amount of treatment that occurs during these stages of the process.

In another aspect of the present invention, it has been discovered that immersion processes for treatment of semiconductor devices are very sensitive to concentration and temperature differences that can occur from batch to batch and from tool to tool. Differences in these process parameters result in a difference in degree of treatment that can have profound effects in variability of manufacturing yield and/or performance of the product being processed. While improvements in process control to provide uniformity in temperature and concentration control are desirable, it is difficult to provide effective control of these parameters to the stringent degree required to provide, for example, single digit Angstrom scale uniformity from batch to batch in etching processes. It further has been discovered relative to this aspect of the invention that merely carrying out a treatment process to a theoretical endpoint and then stopping the treatment process does not properly take into account the treatment that takes place in the immersion vessel on ramp up or, more significantly, ramp down of the treatment process.

Surprisingly, the variability of immersion processes can be significantly lowered by monitoring conditions, and particularly temperature and concentration values, that indicate the progress of the treatment on a real time basis and determining a time $T_T$ in the treatment process to initiate a predetermined treatment termination protocol. The timing of the initiation of the termination process is based on the calculated amount of treatment and treatment rate of the process in progress, and takes into account the contribution of, in particular, the treatment that is carried out during the period of time in the treatment process in which the treatment process is being terminated.

In order to take into account the treatment that occurs in the termination period of the treatment process, one first establishes a predetermined treatment termination protocol, which is a procedure for removing the device from the treatment bath or removing the treating component from the treatment bath, as will be discussed below. The amount of treatment that is expected to take place during the termination protocol is predicted, and the treatment process duration is adjusted on a real time basis to take into account the predicted termination treatment amount and, preferably additionally real time evaluation of the amount of treatment and treatment rate of the treatment during the treatment process.

In one aspect of the present invention, a method is provided for providing low variability surface treating of at least one semiconductor device to be treated on at least one surface thereof in an immersion process, comprising:

a) determining a Desired Treatment Amount of the at least one semiconductor device;

b) determining an Intermediate Target Treatment Amount from the formula:

Intermediate Target Treatment Amount=Desired Treatment Amount−Predicted Termination Treatment Amount, wherein the Predicted Termination Treatment Amount is a predicted amount of final treatment that will occur during execution of a predetermined treatment termination protocol;

c) initiating treatment of at least one semiconductor device in a treatment bath with a treating component;

d) calculating the amount of treatment and treatment rate of the at least one semiconductor device at least a first time $T_1$;

e) determining a time $T_T$ in the treatment process to initiate the predetermined treatment termination protocol to achieve the Intermediate Target Treatment Amount based on the calculated amount of treatment and treatment rate of step d); and f) executing the treatment termination protocol at the time $T_T$ determined in step e).

In a preferred embodiment of the present invention, the calculation of the amount of treatment and treatment rate of the material to be treated during treatment of the at least one semiconductor device is carried out based on at least one physical property determination of the treatment bath taken during the treatment.

BRIEF DESCRIPTION OF THE DRAWINGS

The accompanying drawings, which are incorporated in and constitute a part of this application, illustrate several aspects of the invention. Together with the description of the embodiments serve to explain the principles of the invention. A brief description of the drawings is as follows.

DETAILED DESCRIPTION OF PRESENTLY PREFERRED EMBODIMENTS

Figure 1:
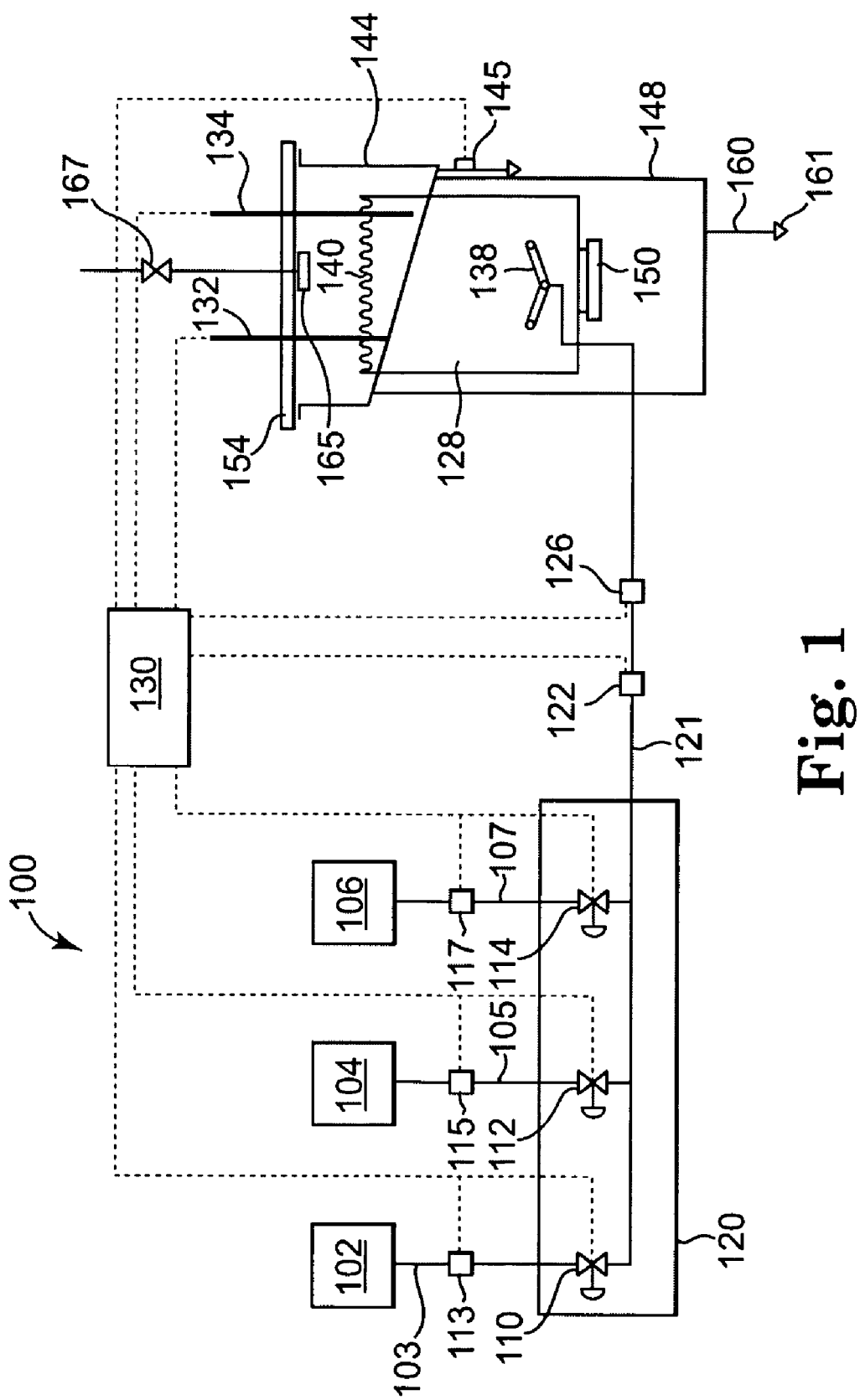
FIG. 1 is a schematic diagram of an exemplary system capable of providing treatment of semiconductor devices in accordance with the process of the present invention.

The embodiments of the present invention described below are not intended to be exhaustive or to limit the invention to the particular embodiments disclosed in the following detailed description. Rather, the embodiments are described so that others skilled in the art can understand the principles and practices of the present invention.

The present invention may be used in any number of treatment processes applicable to semiconductor devices, such as etching, cleaning, rinsing, oxidizing, deposition, plating, stripping, and the like. The majority of the present description will be directed to discussion of etching treatments as an exemplary application. Etching treatments in particular benefit from the present inventive process because of their high sensitivity to variation due to concentration and temperature effects, the high degree of precision particularly desired in this treatment process, and the widespread application of this treatment process in mass production manufacturing where variability from product to product is problematic. It will be understood that the processes as described in the etching context can similarly be applied as appropriate in other treatment processes.

In an exemplary process of the present invention, one or more semiconductor wafers or other substrates are immersed into a treatment bath with the intent of etching a specific target thickness of material from its surfaces, i.e. to achieve a desired endpoint of treatment. The amount of material to be removed is the Desired Treatment Amount in the context of etching processes. Other processes will similarly comprise Desired Treatment Amounts, whether it be expressed in terms of purity, material deposition, oxide film growth, material loss, plating or the like. It will be understood that the amount of treatment may be expressed in any suitable metric, including indirect metrics that are indicative of the desired treatment. For example, where the desired treatment is thickness, the achievement of the desired end point of the process may be evaluated by conductivity or insulative value of the final product. Thus, indirect expressions and evaluations of both treatment and report of progress of treatment are specifically contemplated.

The total amount of treatment that occurs in a treatment process can be divided into at least three phases: 1) the treatment that occurs during the initial phase of the treatment process, 2) the treatment that occurs during the intermediate phase of the treatment process, and 3) the treatment that occurs during the termination phase of the treatment process.

Depending on the procedure being used to initiate the treatment process, the amount of treatment that occurs during the initial phase of the treatment process may be negligible. For example, if the substrate is quickly immersed into a treatment bath that already contains the full intended content of an etching component, the initial phase is quite short. Similarly, if the substrate is placed in treatment bath and the etching component is introduced in a rapid manner, the initial phase may be fairly short in time and similarly considered to be negligible. Certain initiation procedures may impart non-negligible amounts of treatment. In other initiation procedures, the amount of treatment that occurs is sufficiently significant that the treatment must be accounted for, which is discussed in more detail below.

The treatment that occurs during the intermediate phase of the treatment process is where most of the treatment is expected to be accomplished, and which is subject to variability from various causes, such as:

1. Slowly moving changes in water or chemical temperatures, such as day-to-night, or season-to-season,
2. Changes in concentration of the source chemical (e.g. 49% HF not being exactly 49%),
3. Tool to tool repeatability of flow sensor readings, and
4. Drift of flow sensor readings.

Monitoring of concentration and/or temperature of the treatment bath as discussed in more detail herein allows for correction to reduce variability of the etch from these and other causes.

The treatment that occurs during the termination phase of the treatment process has been found to provide a significant component of etching, which can be a source of considerable variation from the desired endpoint if not properly accounted for. Etching, for example, continues in processes using a quick dump rinse, a rinse away process, or an immersion quenching process or a transfer to quench process due to the retention of etchant components adjacent to the surface of the semiconductor device. In the case of a quick dump rinse the etchant solution is drained quickly from the vessel with the wafers still present. Typically a spray of rinse water is initiated from the top as the fluid is drained out the bottom in order to quench the etching. Even though this is done quickly to avoid continued etching, some small amount of etching will still occur. In some cases it is desirable to rinse away the etchant chemical by shutting off the etchant injection and keeping a flow of water going into the vessel to dilute the etchant away until the etch rate becomes low or even negligible. In such a case, the etch amount which occurs during the rinse-away time may be significant compared to the total desired etch amount. In the case of a transfer to quench process, etchant remains associated with the semiconductor device even as it is removed from the bulk tank and before the etch is effectively quenched.

Thus, as part of one embodiment of the present process, one determines an Intermediate Target Treatment Amount from the formula:

Intermediate Target Treatment Amount=Desired Treatment Amount−Predicted Termination Treatment Amount, wherein the Predicted Termination Treatment Amount is a predicted amount of final treatment that will occur during execution of a predetermined treatment termination protocol.

In another embodiment of the present process, one determines an Intermediate Target Treatment Amount from the formula:

Intermediate Target Treatment Amount=Desired Treatment Amount−(Estimated Initiation Treatment Amount+Predicted Termination Treatment Amount), wherein the Estimated Initiation Treatment Amount is a predicted amount of treatment that will occur during initiation of a predetermined treatment initiation protocol.

The Estimated Initiation Treatment Amount and/or the Predicted Termination Treatment Amount can be determined either empirically or can be calculated. The Estimated Initiation Treatment Amount and/or the Predicted Termination Treatment Amount can in one embodiment be set as a constant treatment amount value that is the assumed amount of treatment under all expected treatment processes using the predetermined treatment protocol. Alternatively, the Estimated Initiation Treatment Amount and/or the Predicted Termination Treatment Amount can in one embodiment take into account one or more determined conditions in the process to correct for factors that affect the degree of treatment to be achieved. For example, in the case of the Predicted Termination Treatment Amount, the temperature and/or concentration of the treatment bath can be determined substantially at the time of initiation of the predetermined treatment termination protocol, and the rate of treatment appropriately adjusted to take these factors into account. Similarly, in the case of the Estimated Initiation Treatment Amount, the temperature of the treatment bath can be determined substantially at the time of initiation of the predetermined treatment initiation protocol, and the rate of treatment appropriately adjusted to take this factor into account.

As noted above, in one embodiment the Estimated Initiation Treatment Amount and/or the Predicted Termination Treatment Amount can be determined empirically. In this embodiment, the skilled artisan can through his or her experience in the field provide an educated approximation of the degree of etching that they expect to occur during a particular protocol. For example, having in mind the historical data of etch rate using a particular tool set up, raw material sources and materials to be etched, the skilled artisan is capable of estimating the amount of continued etch that would occur during an initiation or termination protocol. This estimate based on empirical data may or may not be confirmed by further evaluation as processes are performed on an ongoing basis.

In another embodiment, the Estimated Initiation Treatment Amount and/or the Predicted Termination Treatment Amount can be determined by calculation. For example, simple material and energy balances can be used to estimate the amount of etching expected during a rinse-away period (as an example of a predetermined treatment initiation protocol) based on the conditions of the concentration and temperature of the vessel at the start of the rinse-away period and some assumptions about the expected temperature of rinsing fluid. For example, if the contents of the vessel are assumed to be well stirred, the concentration of the etchant in the vessel will decay exponentially as:

$$C(t)=C(0) \times \exp(-t \times F/V)$$

Where t is the time following the start of the rinse-away period in seconds, C(0) is the concentration of the vessel at the start of the rinse-away period, F is the flow rate in liters per second and V is the vessel volume in liters. The etch amount expected during the rinse-away period can then be calculated by substituting this expression for the concentration into the expression for the etch rate and integrating it over the expected rinse time. This information can then be used to determine the start of the rinse-away period.

In a preferred embodiment, the Predicted Termination Treatment Amount is adjusted to take into account the temperature of the treatment bath and/or semiconductor device at the time of initiation of the predetermined treatment termination protocol. In this embodiment in particular, the Intermediate Target Treatment Amount is finally determined during the immersion process in order to fully account for factors that are apparent or arise during the intermediate treatment phase of the process.

The treatment process is initiated in any of a number of conventional ways. For example, in one embodiment, the substrate is placed in a treatment vessel, which is then charged with non-treating liquid (e.g. DI water), to which the etching component is added. Alternatively, the treatment vessel is first filled with non-treating liquid and then the substrate is then immersed in the treatment bath. After immersion of the substrate in the treatment bath, the etching component is added in an appropriate manner as discussed below. In yet another alternative, the treatment vessel is first filled with the liquid that comprises the etching component, and then the substrate is then immersed in the treatment bath.

In one embodiment of the present invention, the etching component is added to the treatment bath containing the substrate in a diffusive manner to increase the concentration in a controlled and relatively uniform manner. A system having diffusion plates and "straightening plates" for diffusively adding liquids is described in U.S. Pat. No. 5,817,185. In a preferred embodiment, the present method is carried out in combination with the treatment process as described in US Published Patent Application US-2003-0188765-A1, entitled "TRANSITION FLOW TREATMENT PROCESS AND APPARATUS" filed Apr. 3, 2002. This process obtains more uniform treatment of objects by introducing a treating chemical to a bath under conditions effective to at least partially envelop the object to be treated in eddy currents of the bath liquid, followed by introducing non-treating liquid into the bath under conditions effective to at least partially envelop the object to be treated in eddy currents of the bath liquid. The method as described therein provides baths that are spatially uniform in concentration, meaning that the concentration of a chemical(s) is well-mixed so as to be as relatively constant as practically feasible throughout the volume of the bath, or at least near the objects to be treated, at any given time.

In an alternative embodiment, a solution containing the etching component can be added in a non-mixing manner to increase the concentration in a stepwise fashion, and the non-treating water can be introduced in a non-mixing manner to decrease the concentration of the etching component in a stepwise fashion, such as described in U.S. Pat. No. 6,245,158.

During the etching process, the concentration of the treating component in the treatment bath and/or the temperature of the treatment bath can be determined. In one embodiment of the present invention, the determinations of the temperature and/or concentration of the treatment bath can be carried out by sensors positioned so that the temperature and/or concentration of the chemical species near the surface of the wafer can be either implied or calculated based on the sensor data, as will now be appreciated by the skilled artisan. In another embodiment of the present invention, the concentration of the treating component in the treatment bath and/or the temperature of the treatment bath can be determined by providing starting materials having a known concentration and/or temperature and controlling the concentration and/or temperature of the treatment bath by controlling the rate of flow and blending of the starting materials into the treatment bath. Preferably, the concentration and/or temperature of the starting material in this embodiment is prequalified and/or measured to assure accuracy of the values upon which subsequent calculations rely. Combinations of both techniques of determining temperature and/or concentration of the treatment bath are expressly contemplated.

The amount of etch and the etching rate of the material (e.g. $SiO_2$ or $Si_3N_4$, organic film(s) and the like) on the surfaces of the wafer at any given point in the process can then be calculated based on a model correlating the temperature and concentration of the chemicals to etch rate. For example, temperature dependence may be modeled using an expression such as:

Etch Rate$(T)$=(Etch Rate $T_0$)×exp $[A×(1/T-1/T_0)]$ where Etch Rate (T) is the etch rate in angstroms per minute at a temperature T in Kelvin (K), Etch Rate ($T_0$) is the etch rate at some nominal temperature $T_0$ (also in units of K) and A is a constant with units K.

Additionally, concentration dependence may be modeled using an expression such as:

Etch Rate$(C)$=Etch Rate$(C_0)$×$C/C_0$ where Etch Rate (C) is the etch rate in angstroms per minute at a concentration of C and Etch Rate ($C_0$) is the etch rate at some nominal concentration $C_0$. Alternatively, concentration dependence may be modeled using an expression such as:

Etch Rate$(C)$=Etch Rate$(C_0)$×$(B+C/C_0)$ where B is an experimentally determined parameter. This equation provides a linear expression to describe the effect of concentration changes in the region near the initial concentration when the overall effect of the concentration is non-linear.

Alternatively, the combined temperature and concentration dependence may also be modeled using an expression such as:

Etch Rate$(T,C)$=Etch Rate$(T_0C_0)$×exp $[A×((1/T-1/T_0))]$×$C/C_0$

Alternatively, the combined temperature and concentration dependence may also be modeled using an expression such as:

Etch Rate$(T,C)$=Etch Rate$(T_0C_0)$×exp $[A×((1/T-1/T_0))]$×$(B+C/C_0)$

Other similar expressions can be used to model more complex dependencies of etch rate on the temperature and concentration, including multi-species models where the concentration is a function of more than one chemical species.

Using one or more of these models, one calculates the amount of treatment and treatment rate of the at least one semiconductor device at least a first time $T_1$, based on the determined concentration of the treating component in the treatment bath and the determined temperature of the treatment bath. This calculation can be a single calculation based on either a single reading or some statistical sampling of the readings of the temperature and or concentration.

If either the temperature or the concentration of the chemical species varies over the length of time that the wafers are immersed in the etchant, multiple readings of the temperature and concentration can be made during the process and the values can be averaged over the duration of the immersion. Of course, more sophisticated averaging techniques can be used for non-linear dependencies, such as the exponential dependence on temperature. For example, in such a case an average of the exp(T) may be made, rather than an average T.

Multiple readings or calculations of temperature and/or concentration can also be used to calculate multiple values of the etch rate and these can be summed together to effectively integrate the etch rate over time to calculate an etch amount. Provided these determinations are made at evenly spaced periods, this is equivalent to calculating an average etch rate over the period of the immersion by summing the individually calculated etch rate values and dividing by the number of calculations.

The control system software of the processing tool then dynamically determines a time $T_T$ in the treatment process to initiate the predetermined treatment termination protocol based on the calculated amount of treatment and treatment rate, so that the Intermediate Target Treatment Amount, and thus the desired treatment endpoint, can be achieved.

Preferred treatment compositions used in the present invention include Wafer Cleaning Systems that are conventional in the art, such as the SC-1 composition ($NH_4OH$/Peroxide/Water), the SC-2 composition (HCl/Peroxide/Water), the Piranha or SPM composition (Sulfuric Acid/Peroxide), SOM (sulfuric acid/ozone) compositions, sulfuric acid compositions, buffered oxide etch (HF and ammonium fluoride) compositions, and $NH_4OH$, $H_3PO_4$, HF, HCl or HF/HCl compositions. Additional preferred treatment compositions include electroless plating compositions and electroplating compositions.

Referring now to FIG. 1, there is shown a system 100 useful for cleaning, etching and rinsing substrates in accordance with the present invention. Generally, system 100 includes component supplies 102, 104 and 106, flow control valves 110, 112, 114 and 167, flow meters 113, 115, 117 and 122, mixing manifold 120, property measuring devices 126, 132, 134 and 145, immersion vessel 128, quick dump valve 150 and rinse spray nozzle 165. System 100 further includes control system 130 that receives and responds to information generated by property measuring devices 126, 132, 134 and 145 to control process parameters such as time of processing or the flow rate provided by flow control valves 110, 112,114 and 167.

The control system in accordance with the present invention can comprise any conventional or developed system capable of receiving actionable input signals from sensors and for providing output signals to control features. Preferably, such a control system comprises one or more microprocessors appropriately combined with memory to permit processing and within which to store relevant control information, such as may have been obtained empirically or analytically. A control system in accordance with the present invention may also comprise components or subsystems appropriately interfaced with one another. For example, a specific immersion processing apparatus may include its own microprocessor based control system. That system may interface with a control system of the fluid supply system in accordance with the present invention so that measuring or sensing devices utilized within the processing chamber or vessel may provide input and may receive output from the control system of the fluid supply system. The sensed temperature and concentration in the processing chamber is used to initiate the predetermined treatment termination protocol.

More specifically, component supply 104, which can possibly be a supply of deoxygenated, deionized (DDI) water, is fluidly coupled to mixing manifold 120 via component supply line 105. Flow rate of component from component supply 104 into mixing manifold 120 can be controlled by controllable valve 112, which is in communication with control system 130.

Component supplies 102 and 106 can supply one or more chemicals useful in treating semiconductor devices, such as etching solutions, cleaning solutions, oxidizing solutions, and the like. In one embodiment, component supply 102 is a supply of hydrofluoric acid (HF) that is fluidly coupled to mixing manifold 120 via component supply line 103. Flow rate of HF from component supply 102 into mixing manifold 120 can be controlled by controllable valve 110, which is in communication with control system 130. Likewise, component supply 106 can be, for example, a supply of hydrochloric acid (HCl) that is fluidly coupled to mixing manifold 120 via component supply line 107. Flow rate of HCl from component supply 106 into mixing manifold 120 can be controlled by controllable valve 114, which is in communication with control system 130.

Flow from component supplies 102, 104 and 106 are combined in mixing manifold 120 via the fluid connection of component supply lines 103, 105 and 107 to mixing manifold 120. Mixing manifold 120 is fluidly connected to mixing manifold line 121 that delivers the prepared blend to immersion vessel 128. Preferably flow control valves 110, 112 and 114 are integral with manifold 120 to minimize dead space in the line between component supplies 102, 104 and 106 and manifold 120. Manifold line 121 has operatively disposed in relation thereto flow meter 122 and property measuring device 126, both in communication with control system 130. For example, property measuring device 126 can be a Horiba CM210 sensor to indirectly measure the concentration of the HF solution using a contactless conductivity sensor. Manifold line 121 feeds fluid to be introduced into the immersion vessel 128 through a fluid introduction system 138. Preferably, the fluid introduction system is a sparger arrangement such as described in US Patent Application Publication No. US-2003-0188765-A1. Immersion vessel 128 has operatively disposed with respect thereto overflow weir 140, weir collection vessel 144 and dump containment vessel 148. In particular, overflow weir 140 is provided to provide for relatively uniform overflow about the edges of immersion vessel 128. Further, weir collection vessel 144 is operatively disposed in relation to dump containment vessel 148, and is shaped so that some portion of any such overflow may advantageously collect in the lower corner thereof. Optionally, properties of fluid being removed from immersion vessel 128 can be determined using property measurement device 145. Any overflow not collected by weir collection vessel 144 will thus collect in dump containment vessel 148. Further, quick dump valve 150 is provided in fluid connection with immersion vessel 128, so that when quick dump valve 150 is opened, the contents of immersion vessel 128 will be allowed to drain into dump containment vessel 148.

Further provided in operational disposition with immersion vessel 128 is lid 154, that is operationally disposed relative to immersion vessel 128 and/or weir collection vessel 144 so that lid 154 may be closed thereupon to provide a substantially contained processing environment. Lid 154 may accommodate one or more means for the introduction of a variety of lines (such as gas lines) or sensing devices. More specifically, temperature measuring device 132 is provided and is operatively disposed within immersion vessel 128 so to be capable of monitoring the temperature of the treatment bath. Concentration measuring device 134 is provided to measure the concentration of the treating component in the treatment bath. All of measuring devices 132, 134 and any other desired such device are in communication with the control system in order to provide measurements in a real time basis as used in the present invention.

Drain line 160 is operatively disposed relative to dump containment vessel 148 and is operationally coupled thereto with an appropriate valve 161 that may be opened in order to drain containment vessel 148.

Of course, various other components, such as filters, check valves, pressure transducers, pressure regulator and the like may be included in system 100 if desired.

One exemplary process that could be carried out in system 100 would be a cascading, single-use hydrofluoric acid etch. In order to do so, the control system would cause flow control valve 112 to allow deoxygenated deionized (DDI) water from component supply 104 to fill immersion vessel 128. Semiconductor wafers (not shown) would be placed into the tank. The control system would then cause flow control valves 112 and 110 to allow deoxygenated deionized (DDI) water from component supply 104 and hydrofluoric acid (HF) from component supply 102, respectively, to be combined within mixing manifold 120. In some applications, it would be desirable to add small amounts of hydrochloric acid to a blended HF etchant. If such an application is desirable, the control system would cause valve 114 to provide an appropriate amount of HCl from component supply 106 to mixing manifold 120. In one embodiment of the present invention, the relative concentrations of HF, HCl (if present) and water flowing to immersion vessel 128 can be calculated using information from flow meters 113, 115 and 117.

The thus prepared blend of HF then flows from mixing manifold 120 through mixing manifold line 121, coming into contact with property measuring device 126. The electrical signals indicative of the concentration of the fluid to be delivered to immersion vessel 128 can be communicated to the control system to indicate and/or confirm the HF concentration thereof. If desired, the control system could then use this information to adjust the flow rate being provided from flow control valves 110 and 112, or to adjust any other process parameters.

The blended etchant would proceed through mixing manifold line 120 into the bottom of immersion tank 148. The concentration of the treating component in the bath in the immersion tank can optionally be measured by concentration measuring device 134.

At this time, the control system could advantageously cause flow control valves 110 and 112 to reduce the flow allowed therethrough proportionately, so as to provide the same concentration of HF as in the desired concentration in the treatment bath, but delivering the blend at a lower flow rate, or at a 'cascade' flow rate. The additional volume of delivered blend would cause immersion vessel 128 to overflow through overflow weir 140, and into either or both of weir collection vessel 144 and dump containment vessel 148. This continual flow of blend or other fluid into immersion vessel 128 can avoid the development of temperature or concentration gradients within immersion vessel 128 during processing, and further can act to remove any contamination from immersion vessel 128.

During etching, concentration measuring device 134 optionally monitors the concentration of HF to provide dynamic measurement on a real time basis of the concentration of the etching component in the treatment bath. Although concentration measuring device 134 is shown to be in the immersion vessel 128, concentration measuring device 134 could alternatively be located on a sample loop adjacent and outside of immersion vessel 128 or otherwise operatively disposed relative to weir collection vessel 144, e.g. at property measuring device 145. Similarly, during etching temperature measuring device 132 optionally measures the temperature of the treatment bath.

If the sensors are located upstream of the tank, rather than either in the tank, or downstream of the tank, the values of the concentration and or temperature near the substrate surface can be estimated based on this data using standard material and energy balance calculations combined with simple models of the fluid flow dynamics of the vessel.

During filling of the tank, the concentration of the chemical in the vessel can be calculated by integrating the incoming concentration over time. Then, once the tank starts overflowing, if the vessel contents are assumed to be well stirred (the same concentration and temperature everywhere within the vessel), then the changing concentration of the chemical species can continue to be calculated based on the continuing stream of data on incoming concentration and flow rate. A similar computation can be made on temperature.

In this manner, the upstream sensors can be used to provide a model of the conditions near the substrate surface. The values of these modeled conditions can then be averaged to calculate an average etch rate, or can be effectively integrated over time to calculate the etch amount.

The determinations of concentration and temperature are communicated to the control system 130. Using these reported determinations of concentration and temperature, the amount of etch and etch rate of the material to be etched at a plurality of time intervals during etching are calculated.

A time is then determined for the immersion process in progress to initiate a predetermined etch termination protocol to achieve a desired etch endpoint. The determination of this time is based on the calculated amount of etch and etch rate as discussed above and a predicted amount of final etch that will occur during execution of the predetermined etch termination protocol. In one embodiment, the etchant chemical is rinsed away by shutting off the etchant from component supplies 102 and 106 at valves 110 and 114, and keeping a flow of water from component supply 104 flowing into immersion vessel 128 to dilute the etchant away until the etch rate becomes low or even negligible. Thus, it is recognized that when the flow of the treatment agent, such as etching component, is stopped from the mixing manifold 120 while continuing to add DI water, it takes some time for the etching component to be removed by dilution from the immersion vessel 128. During this time, etching continues at a progressively lower rate. In another embodiment, a quick dump rinse termination process is used, whereby the etchant solution is drained quickly from immersion vessel 128 at quick dump valve 150 with the wafers still present. At or near the time of draining of immersion vessel 128, valve 167 is opened to provide a spray of rinse water from rinse spray nozzle 165 as the fluid is drained out the bottom in order to quench the etching.

The total amount of predicted amount of final etch that will occur during execution of the predetermined etch termination protocol can be determined empirically, calculated based on the anticipated rate of reduction in etch rate due to predicted concentration and temperature changes over the time of the predetermined etch termination protocol, or combinations of empirical and calculation methodologies as will now be apparent to the skilled artisan.

In an embodiment of the invention, the calculation and/or determination steps are carried out by control system 130. In another embodiment of the invention, the data is reported to a separate system for carrying out the calculation and/or determination steps as described herein. In an embodiment of the present invention, the calculation and determination steps includes taking into account one or more determined conditions, such as temperature, of the treatment bath substantially at the time of initiation of the predetermined treatment termination protocol when determining the Predicted Termination Treatment Amount.

Once the time had been reached as determined to initiate the predetermined etch termination protocol, the predetermined etch termination protocol is executed. In one embodiment, the predetermined etch termination protocol is carried out by the control system causing the flow control valves to close, thereby ceasing flow of blended HF to immersion vessel 128. Immersion tank 128 could then be drained by opening quick dump valve 150 to allow the blended HF to drain out immersion vessel 128. Preferably, supply of blended HF is stopped, followed by supply of a high flow rate of clean DI water for rinsing away the HF and to stop the etching process. In this case, the DI water merely replaces the blended HF within the vessel 128. The substrates then can be dried by any suitable process.

All percentages and ratios used herein are weight percentages and ratios unless otherwise indicated. All publications, patents and patent documents cited are fully incorporated by reference herein, as though individually incorporated by reference. Numerous characteristics and advantages of the invention meant to be described by this document have been set forth in the foregoing description. It is to be understood, however, that while particular forms or embodiments of the invention have been illustrated, various modifications, including modifications to components of the system and the arrangement thereof, and the like, can be made without departing from the spirit and scope of the invention.

What is claimed is:

1. A method for providing low variability surface treating of at least one semiconductor device to be treated on at least one surface thereof in an immersion process, comprising:
   a) determining a Desired Treatment Amount of the at least one semiconductor device;
   b) determining an Intermediate Target Treatment Amount from the formula:

Intermediate Target Treatment Amount=Desired Treatment Amount−Predicted Termination Treatment Amount, wherein the Predicted Termination Treatment Amount is a predicted amount of final treatment that will occur during execution of a predetermined treatment termination protocol;
   c) initiating treatment of at least one semiconductor device in a treatment bath with a treating component;
   d) calculating the amount of treatment and treatment rate of the at least one semiconductor device at least a first time $T_1$;
   e) determining a time $T_T$ in the treatment process to initiate the predetermined treatment termination protocol to achieve the Intermediate Target Treatment Amount based on the calculated amount of treatment and treatment rate of step d); and
   f) executing the treatment termination protocol at the time $T_T$ determined in step e).

2. The method of claim 1, wherein the Intermediate Target Treatment Amount is determined from the formula that additionally includes an Estimated Initiation Treatment Amount as follows:

Intermediate Target Treatment Amount=Desired Treatment Amount−(Estimated Initiation Treatment Amount+Predicted Termination Treatment Amount, wherein the Estimated Initiation Treatment Amount is a predicted amount of treatment that will occur during execution of a predetermined treatment initiation protocol.

3. The method of claim 1, wherein the calculation of the amount of treatment and/or treatment rate of the material to be treated during treatment of the at least one semiconductor device is carried out based on at least one physical property determination of the treatment bath taken during the treatment.

4. The method of claim 3, wherein the physical property determination of the treatment bath comprises at least one determination of concentration of the treating component in the treatment bath during the treatment.

5. The method of claim 3, wherein the physical property determination of the treatment bath comprises at least one determination of temperature of the treatment bath during the treatment.

6. The method of claim 3, wherein the calculation of the amount of treatment and treatment rate of the material to be treated is carried out a plurality of times based on a plurality of physical property determinations during the treatment.

7. The method of claim 1, wherein prediction of the Predicted Termination Treatment Amount takes into account one or more determined conditions in the treatment bath substantially at the time of initiation of the predetermined treatment termination protocol.

8. The method of claim 1, wherein the prediction of the Predicted Termination Treatment Amount takes into account the temperature of the treatment bath substantially at the time of initiation of the predetermined treatment termination protocol.

9. The method of claim 1, wherein the Predicted Termination Treatment Amount is determined empirically.

10. The method of claim 1, wherein the Predicted Termination Treatment Amount is determined by calculating the anticipated rate of reduction in treatment rate due to predicted concentration changes over the time of the predetermined treatment termination protocol.

11. The method of claim 1, wherein the Predicted Termination Treatment Amount is determined by calculating the anticipated rate of reduction in treatment rate due to predicted temperature changes over the time of the predetermined treatment termination protocol.

12. The method of claim 2, wherein the Estimated Initiation Treatment Amount is determined empirically.

13. The method of claim 2, wherein the Estimated Initiation Treatment Amount is determined by calculating the anticipated rate of reduction in etch rate due to predicted concentration and temperature changes over the time of the predetermined treatment termination protocol.

14. The method of claim 1, wherein the concentration of the treating component in the treatment bath is determined by measuring a physical property of the treatment bath.

15. The method of claim 14, wherein the concentration of the treating component in the treatment bath is determined by measuring a physical property of the treatment bath selected from conductivity, light absorptivity, velocity of sound transmission or pH.

16. The method of claim 1, wherein the temperature of the treatment bath is determined by use of a temperature sensor in the bath.

17. The method of claim 1, wherein the treatment is etching, and the treating component is an etching component.

18. The method of claim 17, wherein the etching component in the treatment bath comprises HF.

19. The method of claim 17, wherein the etching component in the treatment bath comprises $NH_4OH$.

20. The method of claim 16, wherein the semiconductor device comprises material to be etched on at least one surface thereof, which material comprises $SiO_2$ or $Si_3N_4$.

* * * * *

UNITED STATES PATENT AND TRADEMARK OFFICE
CERTIFICATE OF CORRECTION

PATENT NO. : 7,312,161 B2  Page 1 of 1
APPLICATION NO. : 11/429572
DATED : December 25, 2007
INVENTOR(S) : Kevin L. Siefering and Steven L. Nelson It is certified that error appears in the above-identified patent and that said Letters Patent is hereby corrected as shown below:

Column 8,
Line 19, "semiconductor device at least" should be -- semiconductor device at at least --.

Signed and Sealed this

Twenty-seventh Day of May, 2008

JON W. DUDAS
*Director of the United States Patent and Trademark Office*